United States Patent
Sim et al.

(10) Patent No.: US 8,436,575 B2
(45) Date of Patent: May 7, 2013

(54) BATTERY ID SETTING SYSTEM AND METHOD OF DRIVING THE SAME

(75) Inventors: Sesub Sim, Suwon-si (KR); Segawa Susumu, Suwon-si (KR); Jongwoon Yang, Suwon-si (KR); Jinwan Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 334 days.

(21) Appl. No.: 12/842,251

(22) Filed: Jul. 23, 2010

(65) Prior Publication Data

US 2011/0175574 A1 Jul. 21, 2011

(30) Foreign Application Priority Data

Aug. 3, 2009 (KR) .................. 10-2009-0071362

(51) Int. Cl.
*H02J 7/00* (2006.01)
*H02J 7/04* (2006.01)

(52) U.S. Cl.
USPC ............ 320/106; 320/121; 320/127; 320/148

(58) Field of Classification Search ................. 320/106, 320/121
See application file for complete search history.

(56) References Cited

U.S. PATENT DOCUMENTS

| | | | | |
|---|---|---|---|---|
| 5,635,813 A | * | 6/1997 | Shiga et al. | 320/106 |
| 5,654,623 A | | 8/1997 | Shiga et al. | |
| 5,767,659 A | * | 6/1998 | Farley | 320/106 |
| 7,418,356 B2 | * | 8/2008 | Jin et al. | 702/63 |
| 8,200,292 B2 | * | 6/2012 | Wu et al. | 455/572 |

| | | | |
|---|---|---|---|
| 2007/0046261 A1 | 3/2007 | Porebski | |
| 2008/0086247 A1 | 4/2008 | Gu et al. | |
| 2009/0146610 A1 | 6/2009 | Trigiani | |
| 2010/0019732 A1 | 1/2010 | Utsumi et al. | |

FOREIGN PATENT DOCUMENTS

| | | |
|---|---|---|
| GB | 2341258 A | 3/2000 |
| JP | 2002-110259 | 4/2002 |
| JP | 2003-174738 | 6/2003 |
| JP | 2003-209932 | 7/2003 |
| JP | 2005-216790 | 8/2005 |
| JP | 2007-151396 | 6/2007 |
| JP | 2008-099482 | 4/2008 |
| JP | 2008-232988 | 10/2008 |
| JP | 2009-513095 | 3/2009 |
| JP | 2010-518566 | 5/2010 |
| KR | 1020060060830 A | 6/2006 |

(Continued)

OTHER PUBLICATIONS

KIPO Notice of Allowance dated May 1, 2012 in corresponding application KR 10-2009-0071362 (5 sheets).

(Continued)

*Primary Examiner* — M'Baye Diao
(74) *Attorney, Agent, or Firm* — Christie, Parker & Hale, LLP

(57) ABSTRACT

A battery identification (ID) setting system effectively managing a plurality of batteries and a method of driving the same. The battery ID setting system having an external terminal includes a master battery management system (BMS) outputting ID setting signals, and a plurality of slave BMSs transmitting battery information signals containing absolute battery IDs and battery potential differences of batteries to the master BMS in response to the ID setting signals. The master BMS receives the battery information signals to assign and store the relative battery IDs corresponding to the absolute battery IDs of the batteries.

18 Claims, 7 Drawing Sheets

FOREIGN PATENT DOCUMENTS

| | | |
|---|---|---|
| KR | 100680901 B1 | 2/2007 |
| KR | 1020070103897 A | 10/2007 |
| KR | 10-2008-0013605 | 2/2008 |
| KR | 10-2008-0032454 | 4/2008 |
| KR | 10-2009-0069189 | 6/2009 |
| WO | WO 02/067347 A1 | 8/2002 |
| WO | WO2007/046657 A1 | 4/2007 |

OTHER PUBLICATIONS

Machine English Translation of JP 2002-110259.
Korean Office Action dated Feb. 22, 2011 for Korean Application No. 10-2009-0071362.
Extended European Search Report dated Nov. 23, 2010 issued by the EPO for the Priority Korean Patent Application No. 10171622.3, 6 pages.
KIPO Office Action dated Oct. 27, 2011, for Korean Priority Patent Application No. 10-2009-0071362, citing the reference in this IDS, as well as JP 2002-110259 and KR 10-2009-0069189, both of which were cited in an IDS dated Mar. 23, 2011, 5 pages.
Japanese Office action dated Sep. 18, 2012, for corresponding Japanese Patent application 2010-162002, (2 pages).
Patent Abstracts of Japan, and English machine translation of Japanese Publication 2007-151396 listed above, (9 pages).
Patent Abstracts of Japan, and English machine translation of Japanese Publication 2008-099482 listed above, (9 pages).
Patent Abstracts of Japan, and English machine translation of Japanese Publication 2008-232988 listed above, (33 pages).

* cited by examiner

FIG. 3

| RELATIVE BATTERY ID | ABSOLUTE BATTERY ID | DATE |
|---|---|---|
| V1<br>·<br>·<br>·<br>Vn | | |

FIG. 5

| RELATIVE BATTERY ID | ABSOLUTE BATTERY ID | DATE |
|---|---|---|
| | | |

BATTERY ID SETTING SYSTEM AND METHOD OF DRIVING THE SAME

CROSS-REFERENCE TO RELATED APPLICATION

This application claims the benefit of Korean Patent Application No. 10-2009-0071362, filed Aug. 3, 2009, in the Korean Intellectual Property Office, the disclosure of which is incorporated herein by reference.

BACKGROUND

1. Field

Aspects of the present invention relate to a battery identification (ID) setting system and a method of driving the same.

2. Description of the Related Art

In general, unlike a primary battery that cannot be charged, a secondary battery is known as the type of battery which is chargeable and dischargeable. The secondary battery is widely employed in cellular phones, laptop computers, camcorders, hybrid vehicles, and the like. In particular, the use of a lithium secondary battery is rapidly increasing because its output voltage is about 4.2 V, which is approximately three times higher than that of a nickel-cadmium battery and a nickel-hydrogen battery which are widely used as power sources of an electronic apparatuses. Also, an energy density per unit weight of the lithium secondary battery is high.

The lithium secondary battery includes a plurality of cells to be applied to a field, in which a high output is required, and employs a battery management system (BMS) managing a control of a cell voltage sensing and a battery cell balancing of the cells. Research on the BMS is conducted so as to more effectively manage the control of the cells.

SUMMARY

Aspects of the present invention provide a battery identification (ID) setting system to effectively manage batteries and a method of driving the same.

According to an aspect of the present invention, a battery ID setting system having an external terminal includes: a master battery management system (BMS) outputting ID setting signals; and a plurality of slave BMSs transmitting battery information signals containing absolute battery IDs and battery potential differences of batteries to the master BMS in response to the ID setting signals, wherein the master BMS receives the battery information signals to assign and store relative battery IDs corresponding to the absolute battery IDs of the batteries.

Each of the slave battery management systems receives the relative battery ID signals containing the relative battery IDs corresponding to the absolute battery IDs of the respective batteries from the master BMS and stores the relative battery IDs corresponding to the respective batteries.

The absolute battery IDs contain serial numbers of the batteries.

The battery potential differences are potential differences between negative terminals of the batteries and ground terminals of the slave BMSs.

The relative battery IDs are set to be sequentially assigned starting with a battery having a lowest battery potential difference to a battery having a highest battery potential difference.

The relative battery IDs are set to correspond to a sequential order from one side to the other side of the batteries in accordance with the battery potential differences of the batteries.

Moreover, the battery ID setting system further includes a plurality of connection switches connected in parallel between the external terminal and the slave BMSs in order to be to be controlled by the slave BMSs.

Each of the connection switches is connected to respective positive terminals of the respective batteries of the slave BMSs when the ID setting signals are transmitted to the slave BMSs.

The master BMS includes: a master controller controlling communications with the slave BMSs; a master communication unit including a communication terminal, from which the ID setting signals and the relative battery ID signals are transmitted and to which the battery information signals are received, and a ground terminal, from which a ground voltage is output; and a master memory storing the absolute battery IDs and the relative battery IDs such that the absolute battery IDs correspond to the relative battery IDs.

Each of the slave BMSs includes: a slave controller controlling communication with the master BMS; a slave communication unit including a communication terminal, to which the ID setting signal and the relative battery ID signal are received and from which the battery information signal is transmitted, and a ground terminal, to which a ground voltage is applied; a slave potential measuring unit measuring the battery potential difference of a respective one of the batteries; and a slave memory storing the absolute battery ID and the relative battery ID such that the absolute battery ID corresponds to the relative battery ID.

The slave potential measuring unit includes: a charge switch connected to a negative terminal of the respective one of the batteries; a resistor, connected to the charge switch, to measure the battery potential difference the respective one of the batteries; a capacitor, connected between a ground terminal of the slave BMS and the resistor, to charge a current that flows through the resistor; and a discharge switch, connected in parallel to the capacitor and between the resistor and the ground terminal of the slave BMS to discharge the current charged in the capacitor.

In accordance with another aspect of the present invention, a method of driving a battery ID setting system including a master battery management system and a plurality of slave battery management systems, the master battery management system performing: transmitting ID setting signals to the slave battery management systems; selecting one of battery information signals containing absolute battery IDs and battery potential differences of batteries transmitted from the slave battery management systems in response to the ID setting signals and confirming whether the selected battery information signal is received; assigning a relative battery ID corresponding to the absolute battery ID from the selected battery information signal and storing the assigned relative battery ID when the selected one of the battery information signals is received; and transmitting relative battery ID signals containing the respective relative battery IDs to corresponding slave BMSs among the slave BMSs.

The master battery management system repeatedly performs the confirming whether the battery information signals are received, the assigning and storing the relative battery IDs, and the transmitting the relative battery ID signals.

Each of the slave BMSs performs: confirming whether the ID setting signal is received; measuring the battery potential difference when the ID setting signal is received; and transmitting the battery information signal to the master BMS.

Each of the slave BMSs performs: confirming whether the relative battery ID signal is received from the master BMS; and storing the relative battery ID when the relative battery ID signal is received.

Each of the slave BMSs performs again the transmitting the battery information signal when the relative battery ID signal is not received.

In the battery ID setting system according to an embodiment of the present invention, the relative battery IDs corresponding to the absolute battery IDs are set to the plurality of batteries so that the states of charge (SOC) and states of health (SOH) of the plurality of batteries may be systematically managed. Therefore, in the battery ID setting system according to an embodiment of the present invention, the plurality of batteries may be effectively managed.

In the battery ID setting system, according to an embodiment of the present invention, the relative battery IDs of the plurality of batteries may be set to correspond to the order of sequential hardware positions of the batteries in consideration of the potential differences of the plurality of batteries. Therefore, in the battery ID setting system, according to an embodiment of the present invention, the plurality of batteries may be easily exchanged and maintained.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 shows an example of a table stored in a master memory of FIG. 2;

FIG. 5 shows an example of a table stored in the first slave memory of FIG. 2;

DETAILED DESCRIPTION OF THE EMBODIMENTS

Figure 1:
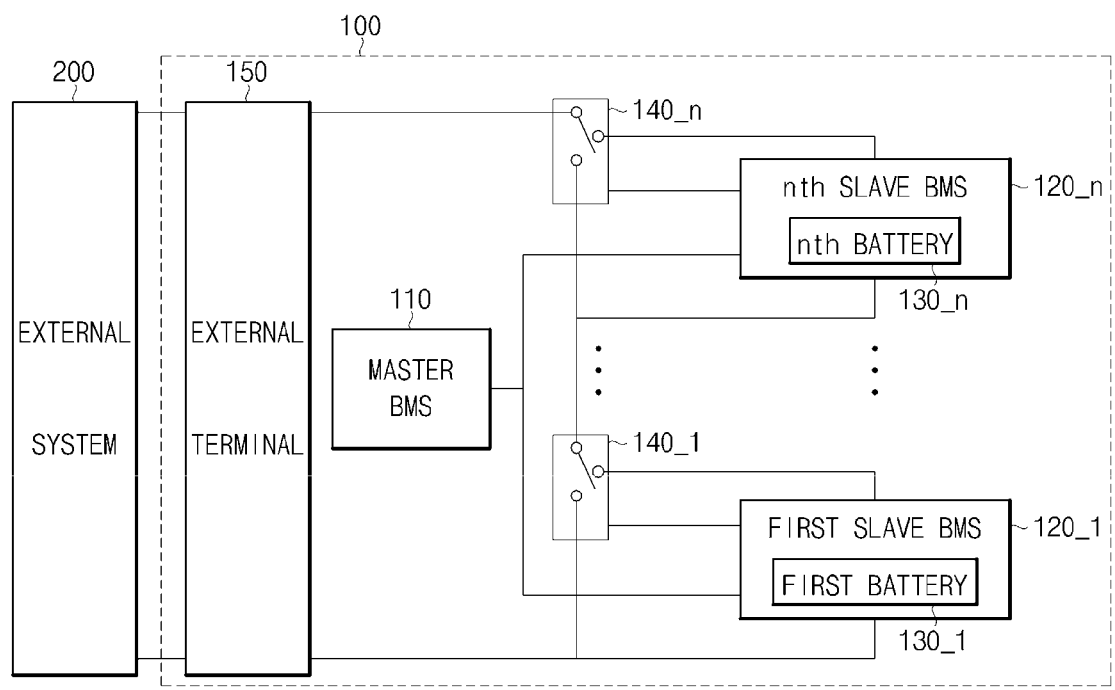
FIG. 1 is a schematic block diagram illustrating a battery ID setting system according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Hereinafter, the embodiments of the present invention will be described in detail with reference to the accompanying drawings.

Figure 2:
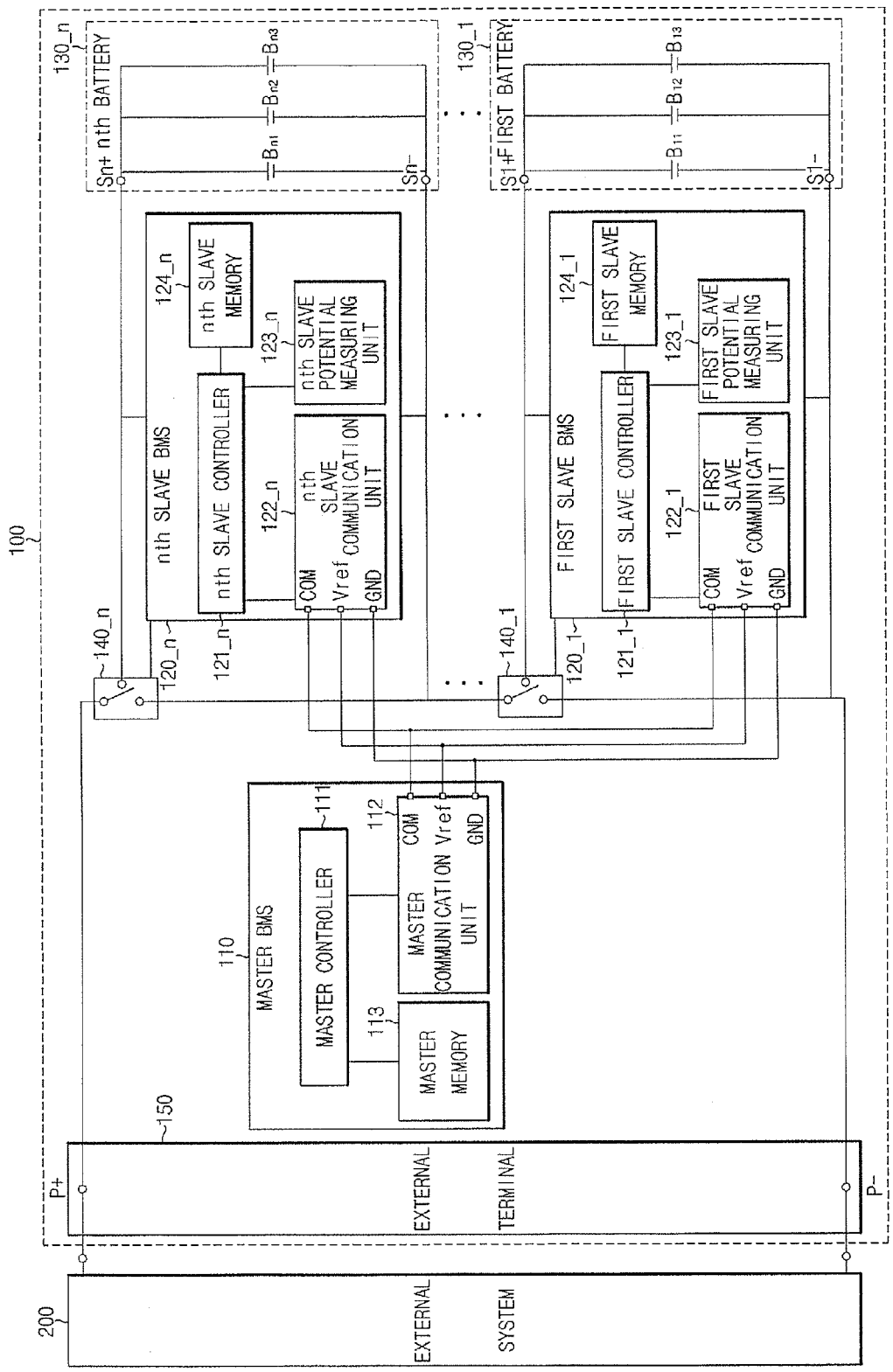
FIG. 2 is a detailed block diagram illustrating the battery ID setting system of FIG. 1.
Figure 4:
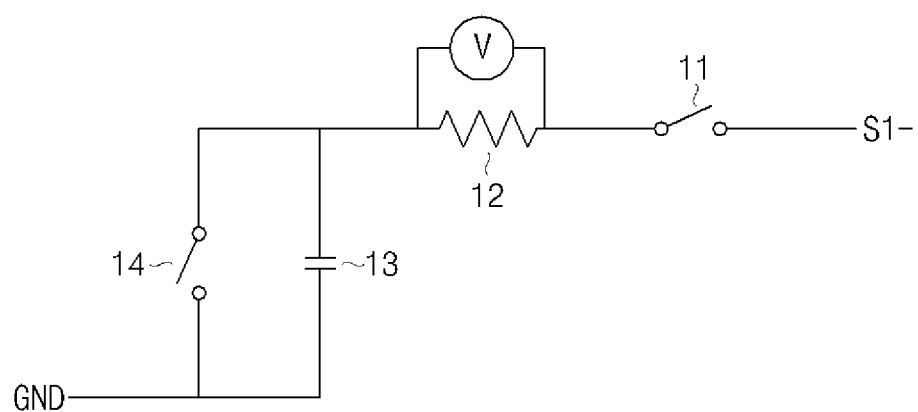
FIG. 4 is a detailed circuit diagram illustrating a first slave potential measuring unit of FIG. 2.

FIG. 1 is a schematic block diagram illustrating a battery ID setting system according to an embodiment of the present invention. FIG. 2 is a detailed block diagram illustrating the battery ID setting system of FIG. 1. FIG. 3 shows an example of a table stored in a master memory of FIG. 2. FIG. 4 is a detailed circuit diagram illustrating a first slave potential measuring unit of FIG. 2. FIG. 5 shows an example of a table stored in the first slave memory of FIG. 2.

Referring to FIGS. 1 and 2, a battery ID setting system 100, according to an embodiment of the present invention, includes a master battery management system (BMS) 110, a plurality of slave BMSs 120_1 to 120_n (wherein, n is a natural number), a plurality of batteries 130_1 to 130_n (wherein, n is a natural number), a plurality of connection switches 140_1 to 140_n (n is a natural number), and an external terminal 150. The battery ID setting system 100 is connected to an external system 200 such as an uninterruptible power system (UPS) or a hybrid vehicle through the external terminal 150 to perform charge or discharge of the batteries 130_1 to 130_n.

The master BMS 110 outputs ID setting signals requesting information in order to set the IDs of the batteries 130_1 to 130_n included in the slave BMSs 120_1 to 120_n when the master BMS 110 is initially connected to the slave BMSs 120_1 to 120_n. The master BMS 110 performs one-to-one communication or one-to-many communication with the slave BMSs 120_1 to 120_n by a controller area network (CAN) communication. The master BMS 110 communicates with the slave BMSs 120_1 to 120_n using the absolute battery IDs of the batteries 130_1 to 130_n. For example, the master BMS 110 communicates with slave BMS 120_1 using the absolute battery ID of the battery 130_1.

The master BMS 110 receives battery information signals containing the absolute battery IDs and the battery potential differences of the batteries 130_1 to 130_n from the slave BMSs 120_1 to 120_n in order to assign relative battery IDs according to the absolute battery IDs and to store the assigned relative battery IDs. The master BMS 110 transmits relative battery ID signals containing the relative battery IDs of the batteries 130_1 to 130_n to the slave BMSs 120_1 to 120_n. The absolute battery IDs contain the serial numbers of the batteries 130_1 to 130_n. The battery potential differences are potential differences between the negative terminals of the batteries 130_1 to 130_n and the ground terminals of the slave BMSs 120_1 to 120_n. For example, the battery potential difference of battery 130_1 is potential difference between the negative terminal of the battery 130_1 and the ground terminal of the slave BMS 120_1. The relative battery IDs are the relative addresses of the batteries 130_1 to 130_n set by the master BMS 110 in order to manage the batteries 130_1 to 130_n. For example, the relative battery IDs are set as V1, V2, . . . , and Vn in accordance with the battery potential differences of the batteries 130_1 to 130_n and are different from the predetermined absolute battery IDs.

Referring to FIG. 2, the master BMS 110 includes a master controller 111, a master communication unit 112, and a master memory 113.

The master controller 111 controls communications with the slave BMSs 120_1 to 120_n and controls the master communication unit 112 and the master memory 113. The master controller 111 assigns the relative battery IDs corresponding to the absolute battery IDs to the batteries 130_1 to 130_n according to the battery information signals received from the slave BMSs 120_1 to 120_n. For example, the master controller 111 sequentially assigns V1, V2, . . . , and Vn, which are the relative battery IDs, to the batteries 130_1 to 130_n in a respective manner starting with the battery having the lowest battery potential difference. In other words, in the case where battery 130_1 has the lowest battery potential, the master controller 111 assigns the relative battery ID V1 to battery 103_1.

The master communication unit 112 communicates with the respective slave BMSs 120_1 to 120_n under the control of the master controller 111. The master communication unit 112 includes a communication terminal COM which transmits the ID setting signals and the relative battery ID signals and receives the battery information signals. The relative battery ID signals include the relative battery IDs. The master communication unit 112 includes a reference voltage terminal Vref, from which a reference voltage is output, and a ground terminal GND, from which a ground voltage is output.

The master memory 113 stores the absolute battery IDs of the batteries 130_1 to 130_n and the relative battery IDs of the batteries 130_1 to 130_n assigned by the master controller 111 such that the absolute battery IDs correspond to the relative battery IDs according to the battery information signals transmitted to the master BMS 110. To this end, the master memory 113 establishes the table illustrated in FIG. 3. According to FIG. 3, a date is input into a date field when relative battery IDs are assigned.

The slave BMSs 120_1 to 120_n include the batteries 130_1 to 130_n, respectively, and transmit the battery information signals to the master MBS 110 in response to the ID setting signals of the master BMS 110. The battery information signals contain the absolute battery IDs and the battery potential differences of the batteries 130_1 to 130_n. By doing so, each of the slave BMSs 120_1 to 120_n enables the master BMS 110 to set the relative battery IDs corresponding to the absolute battery IDs according to the battery information signals of the batteries 130_1 to 130_n. Therefore, the master BMS 110 systematically manages the state of charge (SOC) and state of health (SOH) of the respective batteries 130_1 to 130_n. Although not shown, according to the present embodiment, each of the slave BMSs 120_1 to 120_n include a device to measure the voltage and current of each of the batteries 130_1 to 130_n and to manage the charge and discharge states of the batteries 130_1 to 130_n. For example, the slave BMS 120_1 includes a device to measure the voltage and current of the battery 130_1 and to manage the charge and discharge state of the battery 130_1.

The respective slave BMSs 120_1 to 120_n receive the relative battery ID signals containing the relative battery IDs of the batteries included therein from the master BMS 110 to store the relative battery IDs. By doing so, the respective slave BMSs 120_1 to 120_n get the respective relative battery IDs included in the relative battery ID signals. Therefore, the respective slave BMSs 120_1 to 120_n communicate with the master BMS 110 using the relative battery IDs in addition to the absolute battery IDs of the respective batteries 130_1 to 130_n.

Hereinafter, the slave BMSs 120_1 to 120_n will be described taking the first slave BMS 120_1 as an example.

The first slave BMS 120_1 includes a first slave controller 121_1, a first slave communication unit 122_1, a first slave potential measuring unit 123_1, and a first slave memory 124_1.

The first slave controller 121_1 controls communications with the master BMS 110 and controls the first slave communication unit 122_1, the first slave potential measuring unit 123_1, and the first slave memory 124_1 respectively.

The first slave communication unit 122_1 communicates with the master BMS 110 under the control of the first slave controller 121_1. The first slave communication unit 122_1 includes a communication terminal COM, to which the ID setting signal and the relative battery ID signal are received and from which the battery information signal is transmitted. The first slave communication unit 122_1 includes a reference voltage terminal Vref, to which the reference voltage of the master BMS 110 is applied, and a ground terminal GND, to which the ground voltage of the master BMS 110 is applied.

The first slave potential measuring unit 123_1 measures the battery potential difference of the first battery 130_1 under the control of the first slave controller 121_1. In detail, as illustrated in FIG. 4, the first slave potential measuring unit 123_1 includes a charge switch 11, a resistor 12, a capacitor 13, and a discharge switch 14.

Referring to FIG. 4, the charge switch 11 is connected to a negative terminal S1− of the first battery 130_1. The charge switch 11 is turned on under the control of the first slave controller 121_1 when the first slave BMS 120_1 receives the ID setting signal from the master BMS 110.

The resistor 12 is connected between the charge switch 11 and the ground terminal GND of the first slave BMS 120_1. When the charge switch 11 is turned on, current flows through the resistor 12. Therefore, a battery potential difference V between the ground terminal GND of the first slave BMS 120_1 and the negative terminal S1− of the first battery 130_1 is obtained across ends of the resistor 12.

The capacitor 13 is connected between the resistor 12 and the ground terminal GND of the first slave BMS 120_1. The capacitor 13 charges the current that flows through the resistor 12 to prevent the current from suddenly flowing to the first slave BMS 120_1.

The discharge switch 14 is connected to the capacitor 13 in parallel between the resistor 12 and the ground terminal GND of the first slave BMS 120_1 and is turned on when the charge switch 11 is turned off to discharge the current charged in the capacitor 13. Therefore, the discharge switch 14 makes the capacitor 13 discharged.

The first slave memory 124_1 stores the absolute battery ID and the relative battery ID of the first battery 130_1 to correspond each other. To this end, the first slave memory 124_1 establishes a table as illustrated in FIG. 5. In FIG. 5, the field of date is to input date at which the relative battery ID is assigned.

Each of the batteries 130_1 to 130_n are included in the respective slave BMSs 120_1 to 120_n. For example, the battery 130_1 is included in the slave BMS 120_1. However, in FIG. 2, for convenience sake, the batteries 130_1 to 130_n are shown to be separated from the slave BMSs 120_1 to 120_n. The batteries 130_1 to 130_n are serially connected to each other.

The plurality of batteries 130_1 to 130_n will be described with respect to the first battery 130_1 as an example. The first battery 130_1 has a plurality of cells B11 to B13 connected in parallel so that a large quantity of power is supplied to an external system 200. The cells B11 to B13 may be chargeable cells, for example, lithium secondary cells, however aspects of the present invention are not limited thereto. Although in the present embodiment, the number of cells is three, aspects of the present invention are not limited thereto.

The plurality of connection switches 140_1 to 140_n are connected between the external terminal 150 and the respective slave BMSs 120_1 to 120_n in parallel and are controlled by the respective slave BMSs 120_1 to 120_n.

The respective connection switches 140_1 to 140_n are connected to the positive terminals of the respective batteries 130_1 to 130_n when the ID setting signals are transmitted from the master BMS 110 to the respective slave BMSs 120_1 to 120_n. For example, when the ID setting signal is transmitted from the master BMS 110 to the first slave BMS 120_1, the first connection switch 140_1 is connected to the positive terminal S1+ of the first battery 130_1 under the control of the first slave BMS 120_1. When the ID setting signal is transmitted from the master BMS 110 to the nth slave BMS 120_n, the nth connection switch 140_n is connected to the positive terminal Sn+ of the nth battery 130_n under the control of the nth slave BMS 120_n. As described above, when the respective connection switches 140_1 to 140_n are connected to the respective positive terminals S1+ to Sn+ of the batteries 130_1 to 130_n, the respective battery potential differences V of the batteries 130_1 to 130_n are obtained.

The external terminal 150 is connected to the slave BMSs 120_1 to 120_n and is connected to the external system 200 to serve as a terminal when the batteries 130_1 to 130_n are charging or discharging. In the drawing, P+ denotes a positive terminal connected to the positive terminal Sn+ of the nth battery 130_n and P− denotes a negative terminal connected to the negative terminal S1− of the first battery 130_1.

As described above, the battery ID setting system 100 sets the relative battery IDs corresponding to the absolute battery IDs so that the SOC and SOH of the batteries 130_1 to 130_n are systemically managed. Therefore, the battery ID setting system 100 effectively manages the batteries 130_1 to 130_n.

Moreover, the battery ID setting system 100 sets the relative battery IDs of the batteries 130_1 to 130_n to correspond to the order of sequential hardware positions from one side to the other side of the batteries 130_1 to 130_n in consideration of the battery potential differences of the batteries 130_1 to 130_n. Therefore, the battery ID setting system 100 lets an exchange manager easily perceive which battery is to be exchanged when one of the batteries 130_1 to 130_n has a problem. Therefore, the battery ID setting system 100 enables the easy exchange and management of the plurality of batteries 130_1 to 130_n.

A method of driving the battery ID setting system 100, according to another embodiment of the present invention, will be described below with reference to FIGS. 1 to 5.

Figure 6:
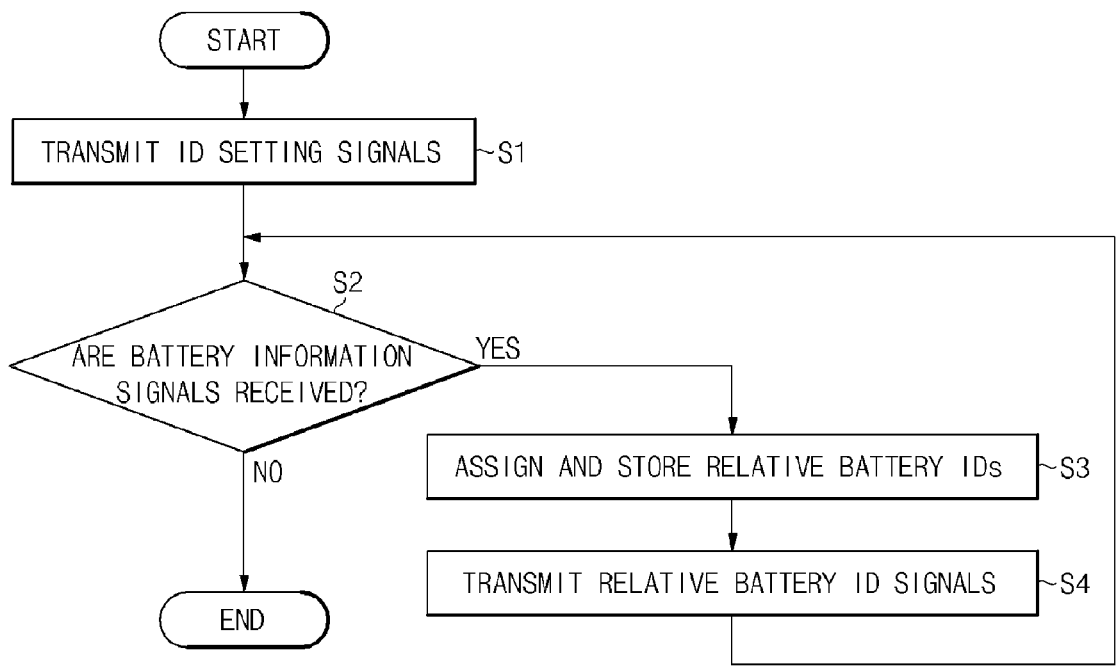
FIG. 6 is a flowchart illustrating the operation of a master battery management system (BMS) in the battery ID setting system of FIG. 2.
Figure 7:
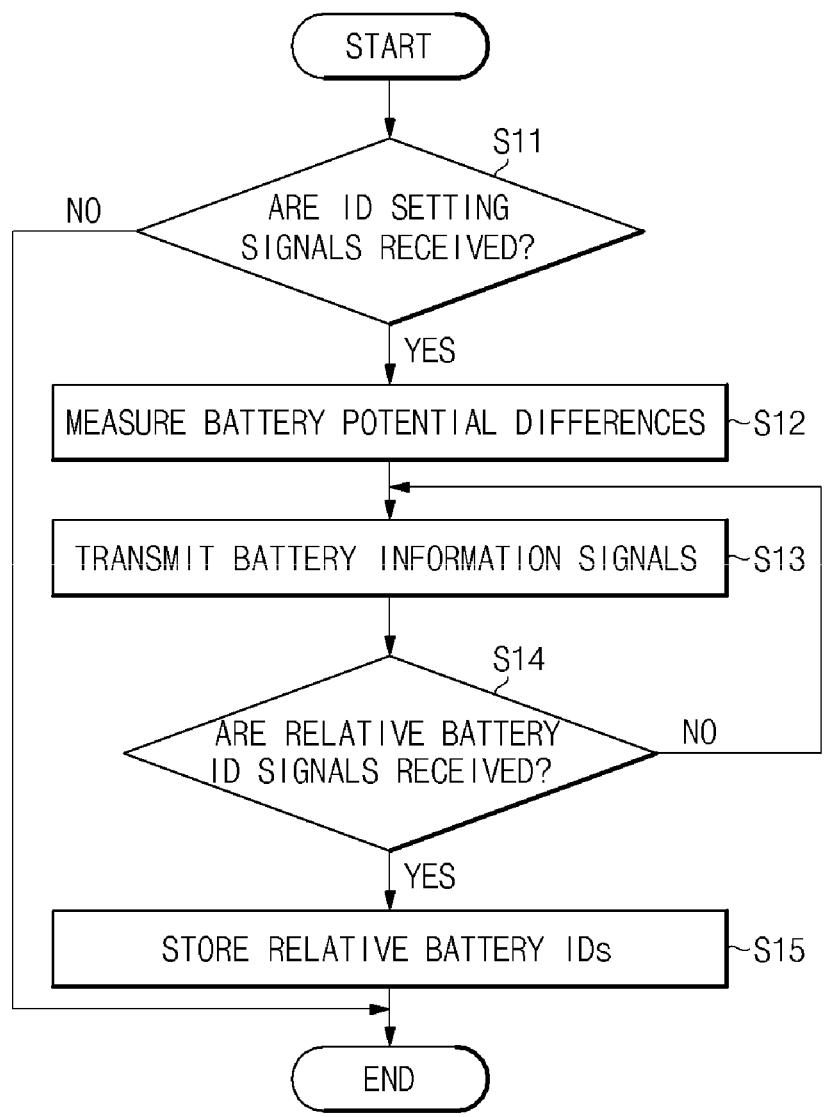
FIG. 7 is a flowchart illustrating the operation of a slave BMS in the battery ID setting system of FIG. 2.

FIG. 6 is a flowchart illustrating the operation of a master battery management system (BMS) in the battery ID setting system of FIG. 2. FIG. 7 is a flowchart illustrating the operation of a slave BMS in the battery ID setting system of FIG. 2.

The battery ID setting system 100 includes the master BMS 110, the plurality of slave BMSs 120_1 to 120_n, the plurality of batteries 130_1 to 130_n, the plurality of connection switches 140_1 to 140_n, and the external terminal 150. Hereinafter, the method of driving the battery ID setting system 100 will be described with a focus on the master BMS 110 and the slave BMSs 120_1 to 120_n.

First, it is assumed that the batteries 130_1 to 130_n, which are included in the slave BMSs 120_1 to 120_n, output the same output voltage, for example, 4V. However, aspects of the present invention are not limited thereto.

Referring to FIG. 6, in the method of driving the battery ID setting system, the master BMS 110 performs an operation including transmitting the ID setting signals (S1), confirming whether the battery information signals are received (S2), assigning and storing the relative battery IDs (S3), and transmitting the relative battery ID signals (S4).

In transmitting the ID setting signals (S1), the master BMS 110 transmits the ID setting signals to the slave BMSs 120_1 to 120_n requesting information in order to set the IDs of the respective batteries 130_1 to 130_n. The transmission of the ID setting signals (S1) is performed when the master BMS 110 is initially connected to the slave BMSs 120_1 to 120_n.

In confirming whether the battery information signals are received (S2), the master BMS 110 selects one of the battery information signals containing the absolute battery IDs and battery potential differences of the batteries 130_1 to 130_n transmitted from the slave BMSs 120_1 to 120_n in response to the ID setting signals and confirms whether the selected battery information signal is received. Here, the master BMS 110 receives the battery information signal of the battery having the smallest battery potential difference among the plurality of batteries 130_1 to 130_n. For example, in the case where the absolute battery ID of the first battery 130_1 is serial number 1 and its battery potential difference is 0 V (zero volts), and the absolute battery ID of the second battery 130_2 is the serial number 2 and its battery potential difference is 4 V, the master BMS 110 receives the battery information signal of the first battery 130_1. Additionally, the master BMS 110 ignores the battery information signal of the second battery 130_2.

In assigning and storing the relative battery IDs (S3), when it is confirmed that one of the battery information signals of the batteries 130_1 to 130_n is selected and received, the master BMS 110 assigns and stores the relative battery ID corresponding to the absolute battery ID. When it is confirmed that the battery information signal of the first battery 130_1 is received, the master BMS 110 assigns the relative battery ID V1 to the absolute battery ID serial number 1 and stores the absolute battery ID and the relative battery ID such that the serial number 1 corresponds to V1. The relative battery ID of the first battery 130_1 is set as V1 since the master BMS 110 sequentially assigns the relative battery IDs as V1, V2, . . . , and Vn starting from the battery having the lowest battery potential difference and going to the battery having the highest battery potential difference.

In transmitting the relative battery ID signals (S4), the master BMS 110 transmits the relative battery ID signal containing the relative battery ID to corresponding slave BMSs so that the corresponding slave BMSs recognize the relative battery ID of the battery included therein. For example, the master BMS 110 transmits the relative battery ID signal containing the relative battery ID V1 of the first battery 130_1 to the first slave BMS 120_1 so that the first slave BMS 120_1 recognizes the relative battery ID V1 of the first battery 130_1.

The master BMS 110 again confirms that the battery information signals are received (S2) after transmitting the relative battery ID signals (S4). The master BMS 110 then assigns and stores the relative battery IDs (S3) and transmits the relative battery ID signals (S4) again. For example, the master BMS 110 selects one of the battery information signals containing the absolute battery IDs and the battery potential differences of the batteries 130_2 to 130_n from the slave BMSs 120_2 to 120_n and confirms whether the selected battery information signal is received. The master BMS 110 receives the battery information signal of the battery having the smallest battery potential difference among the batteries 130_2 to 130_n. For example, when the absolute battery ID of the second battery 130_2 is the serial number 2, the battery potential difference of the second battery 130_2 is 4 V, the absolute battery ID of the third battery 130_3 is the serial number 3, and the battery potential difference of the third battery 130_3 is 8 V, the master BMS 110 receives the battery information signal of the second battery 130_2. Then, the master BMS 110 ignores the battery information signal of the third battery 130_3.

As described above, the master BMS 110 sequentially assigns the relative battery IDs to the respective batteries 130_1 to 130_n without communication collision and stores the assigned relative battery IDs.

Referring to FIG. 7, in the method of driving the battery ID setting systems, the slave BMSs 120_1 to 120_n perform the operation including confirming whether the ID setting signals are received (S11), measuring the battery potential differences (S12), transmitting the battery information signals (S13), confirming whether the relative battery ID signals are received (S14), and storing the relative battery IDs (S15).

In confirming whether the ID setting signals are received (S11), the slave BMSs 120_1 to 120_n confirm whether the ID setting signals are received from the master BMS 110. When it is confirmed that the ID setting signals are received, the slave BMSs 120_1 to 120_n turn on the respective connection switches 140_1 to 140_n to connect the external terminal 150 to the batteries 130_1 to 130_n. For example, the nth slave BMS 120_n turns on the nth connection switch 140_n to connect the positive terminal P+ of the external terminal 150 to the positive terminal Sn+ of the nth battery 130_n.

In operation of measuring the battery potential differences (S12), when the ID setting signals are received and the external terminal 150 are connected to the batteries 130_1 to 130_n, the slave BMSs 120_1 to 120_n measure the battery potential differences of the batteries 130_1 to 130_n. The battery potential differences may be potential differences between the negative terminals of the batteries 130_1 to 130_n and the ground terminals of the slave BMSs 120_1 to 120_n, however aspects of the present invention are not limited thereto and other terminals may be used to determine the battery potential differences. For example, considering that the output voltages of the batteries 130_1 to 130_n are 4 V when the ground voltages of the slave BMSs 120_1 to 120_n are 0 V, the battery potential difference of the first battery 130_1 is 0 V, the battery potential difference of the second battery 130_2 is 4 V, the battery potential difference of the third battery 130_3 is 8 V, and the battery potential difference of the nth battery 130_n is (n−1)×4 V. The battery potential differences of the plurality of batteries 130_1 to 130_n are considered when the master BMS 110 assigns the relative battery IDs of the batteries 130_1 to 130_n.

In operation of transmitting the battery information signals (S13), the slave BMSs 120_1 to 120_n transmit the battery information signals containing the absolute battery IDs and the battery potential differences of the batteries 130_1 to 130_n to the master BMS 110.

In confirming whether the relative battery ID signals are received (S14), the respective slave BMSs 120_1 to 120_n confirm whether the relative battery ID signals containing the relative battery IDs assigned by the master BMS 110 are received.

In storing the relative battery IDs (S15), when the relative battery ID signals are received, the respective slave BMSs 120_1 to 120_n store the relative battery IDs corresponding to the batteries included therein.

On the other hand, in confirming whether the relative battery ID signals are received (S14), when the relative battery ID signals are not received for a period of time, the respective slave BMSs 120_1 to 120_n perform the operation from transmitting the battery information signals (S13) again.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery identification (ID) setting system comprising:
   a master battery management system (BMS) for outputting an ID setting signal; and
   a plurality of slave BMSs for transmitting battery information signals containing absolute battery IDs and battery potential differences of batteries to the master BMS in response to receiving the ID setting signal,
   wherein the master BMS is configured to receive the battery information signals, to assign and store relative battery IDs corresponding to the absolute battery IDs of the batteries based on the battery potential differences, and to transmit relative battery ID signals containing the relative battery IDs assigned by the master BMS.

2. The battery ID setting system of claim 1, wherein each of the slave BMSs is configured to receive one of the relative battery ID signals containing one of the relative battery IDs corresponding to one of the absolute battery IDs of a respective one of the batteries from the master BMS, and to store the one of the relative battery IDs corresponding to the respective one of the batteries.

3. The battery ID setting system of claim 1, wherein the absolute battery IDs comprise serial numbers of the batteries.

4. The battery ID setting system of claim 1, wherein the battery potential differences are potential differences between negative terminals of the batteries and ground terminals of the slave BMSs.

5. The battery ID setting system of claim 1, wherein the relative battery IDs are configured to be sequentially assigned starting with one of the batteries having a lowest one of the battery potential differences and ending with one of the batteries having a highest one of the battery potential differences.

6. The battery ID setting system of claim 1, wherein the relative battery IDs correspond to a sequential order from one side to the other side of the batteries in accordance with the battery potential differences of the batteries.

7. The battery ID setting system of claim 1, further comprising a plurality of connection switches configured to be connected in parallel between an external terminal and the slave BMSs, and to be controlled by the slave BMSs.

8. The battery ID setting system of claim 7, wherein each of the connection switches is configured to be connected to a positive terminal of a respective one of the batteries of the slave BMSs when the ID setting signal is transmitted to the slave BMSs.

9. The battery ID setting system of claim 1, wherein the master BMS comprises:
   a master controller for controlling communications with the slave BMSs;
   a master communication unit comprising:
      a communication terminal for transmitting the ID setting signal and the relative battery ID signals, and for receiving the battery information signals; and
      a ground terminal for outputting a ground voltage; and
   a master memory for storing the absolute battery IDs and the relative battery IDs such that the absolute battery IDs correspond to the relative battery IDs.

10. The battery ID setting system of claim 1, wherein each slave BMS of the slave BMSs comprises:
    a slave controller for controlling communication with the master BMS;
    a slave communication unit comprising:
       a communication terminal for receiving the ID setting signal and one of the relative battery ID signals, and for transmitting one of the battery information signals; and
       a ground terminal for receiving a ground voltage;
    a slave potential measuring unit for measuring one of the battery potential differences for a respective one of the batteries; and
    a slave memory for storing a corresponding one of the absolute battery IDs and a corresponding one of the relative battery IDs.

11. The battery ID setting system of claim 10, wherein the slave potential measuring unit comprises:
    a charge switch connected to a negative terminal of the respective one of the batteries;
    a resistor connected to the charge switch and configured to measure the one of the battery potential differences for the respective one of the batteries;
    a capacitor connected between a ground terminal of the slave BMS and the resistor, and configured to charge a current that flows through the resistor; and a discharge switch connected in parallel to the capacitor and between the resistor and the ground terminal of the slave BMS, and configured to discharge the current charged in the capacitor.

12. A method of driving a battery ID setting system comprising a master battery management system (BMS) and a plurality of slave BMSs, the master BMS performing:
- transmitting an ID setting signal to the slave BMSs;
- receiving battery information signals containing absolute battery IDs and battery potential differences of batteries transmitted from the slave BMSs in response to the ID setting signal;
- selecting one of the battery information signals based on the battery potential differences received from the slave BMSs;
- assigning one of relative battery IDs corresponding to a respective one of the absolute battery IDs from the selected one of the battery information signals and storing the assigned one of the relative battery IDs when the selected one of the battery information signals is received; and
- transmitting relative battery ID signals containing respective ones of the relative battery IDs assigned by the master BMS to corresponding ones of the slave BMSs.

13. The method of claim 12, further comprising the master BMS repeatedly performing the selecting of one of the battery information signals, and the assigning and storing of the one of the relative battery IDs.

14. The method of claim 12, further comprising each of the slave BMSs performing:
- receiving the ID setting signal;
- measuring one of the battery potential differences when the ID setting signal is received; and
- transmitting one of the battery information signals to the master BMS.

15. The method of claim 14, further comprising each of the slave BMSs further performing:
- receiving one of the relative battery ID signals from the master BMS; and
- storing one of the respective relative battery IDs when the one of the relative battery ID signals is received.

16. The method of claim 15, further comprising each of the slave BMSs further performing repeating the transmitting of the one of the battery information signals to the master BMS when the one of the relative battery ID signals is not received.

17. The battery ID setting system of claim 1, wherein the slave BMSs are configured to receive the relative battery ID signals containing the relative battery IDs corresponding to the absolute battery IDs of the batteries from the master BMS and to store the relative battery IDs corresponding to respective ones of the batteries.

18. A method of assigning relative battery identifications (IDs) according to respective battery potential differences of a plurality of batteries, the method comprising:
- transmitting an ID setting signal;
- receiving battery information signals having absolute battery IDs and the respective battery potential differences transmitted in response to the ID setting signal;
- assigning the relative battery IDs corresponding to respective ones of the absolute battery IDs of the plurality of batteries and based on the respective battery potential differences, and storing the assigned relative battery IDs; and
- transmitting relative battery ID signals containing the assigned relative battery IDs.

* * * * *